United States Patent [19]

Lichtenegger

[11] 4,438,332

[45] Mar. 20, 1984

[54] DETECTOR FOR AN ELECTRON MICROSCOPE

[75] Inventor: Siegried Lichtenegger, Eindhoven, Netherlands

[73] Assignee: U.S. Philips Corporation, New York, N.Y.

[21] Appl. No.: 465,087

[22] Filed: Feb. 9, 1983

Related U.S. Application Data

[63] Continuation of Ser. No. 308,732, Oct. 5, 1981, abandoned, which is a continuation of Ser. No. 137,865, Apr. 7, 1980, abandoned.

[30] Foreign Application Priority Data

Apr. 13, 1979 [NL] Netherlands ......................... 7902963

[51] Int. Cl.³ ............................................ G01N 23/00
[52] U.S. Cl. ..................................... 250/310; 250/397
[58] Field of Search ........................ 250/310, 311, 397

[56] References Cited

U.S. PATENT DOCUMENTS

| | | | |
|---|---|---|---|
| 3,351,755 | 11/1967 | Hasler | 250/310 |
| 3,922,546 | 11/1975 | Livesay | 250/310 |
| 4,149,074 | 4/1979 | Schliepe et al. | 250/311 |
| 4,211,924 | 7/1980 | Müller et al. | 250/311 |

*Primary Examiner*—Bruce C. Anderson
*Attorney, Agent, or Firm*—Paul R. Miller

[57] ABSTRACT

A detection system of an electron microscope comprises a number of detection elements which are arranged on ends of flexible optical conductor bundles which face a specimen. The other ends of the optical conductor bundles are optically coupled to a light passage block which is made of a clear material having a comparatively high refractive index. Each detection element can be separately read by means of a diaphragm system which is arranged between this block and a photomultiplier coupled thereto.

11 Claims, 5 Drawing Figures

DETECTOR FOR AN ELECTRON MICROSCOPE

This application is a continuation application of previous parent U.S. Application, Ser. No. 308,732, filed Oct. 5, 1981, which is a continuation of parent application Ser. No. 137,865, filed Apr. 7, 1980, now abandoned, and the benefits of these earlier filed applications are hereby claimed for the present application.

The invention relates to an electron microscope, comprising an electron source for generating an electron beam, a specimen table which is arranged in a specimen chamber, and a detection system for detecting radiation occurring after interaction between the electron source and the specimen.

An electron microscope of this kind which is constructed as a scanning electron microscope is known from U.S. Pat. No. 3,842,271. A specimen chamber thereof accommodates a detector comprising an optical conductor, a scintillation element being mounted on an end thereof which faces the specimen.

For example, in a scanning electron microscope it is often desirable to measure several kinds of radiation as well as radiation in different directions with respect to a specimen surface. A strict condition to be satisfied in this respect is that the distance between the last lens of the microscope and the specimen must be comparatively small in order to prevent adverse influencing of the electron target spot on the specimen. Furthermore, the specimen chamber should be readily accessible for the exchanging and positioning of specimens as well as detectors. In electron microscopes comprising known detector systems, difficulties are then experienced, which imposes restrictions with respect ot the freedom of measurement of all desired signals from as many as possible positions.

The present invention has for its object to mitigate these problems. To this end, an electron microscope of the kind set forth in accordance with the invention is characterized in that the detection system comprises several detection elements each of which comprises a flexible optical conductor whose end faces the specimen table and comprises an entrance screen which is sensitive to the radiation to be detected. The detection system further comprises selection means for selecting signals from at least one of the detector elements.

Because the detection elements of the detection system in accordance with the present invention are arranged on a flexible bundle of optical conductors, they can be simply placed in all positions and no problems are encountered when the specimen chamber is opened or closed. Moreover, the detection element can be moved along a given path from the outside with the aid of simple means.

In a preferred embodiment in accordance with the present invention, the detection elements comprise a layer of luminescent material which is deposited on a transparent supporting plate which in its turn is arranged on a light funnel conducting the light generated in the luminescent material to the entrance of the optical conductor. Preferably, the layer of luminescent material on the free surface is covered with a thin layer of aluminium for reflection of luminescent light.

In a preferred embodiment, several detection elements are accommodated in the specimen chamber of, for example, a scanning electron microscope, and the ends of the optical conductors which are remote from the detection elements are mounted in a common transparent block which also serves as a vacuum passage through the specimen chamber. On the outside, for example, a photomultiplier can be connected directly to the block. In a preferred embodiment, a diaphragm system is connected to the passage block, so that a channel selection can be made, for example, by rotation of a diaphragm plate.

Some preferred embodiments in accordance with the invention will be described in detail hereinafter with reference to the accompanying diagrammatic drawing.

Figure 1:
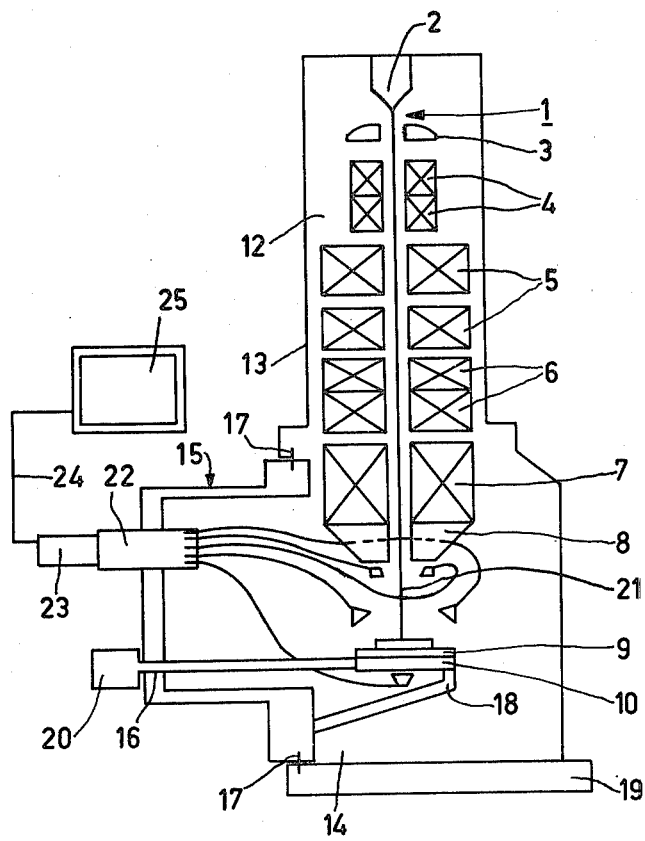
FIG. 1 shows a scanning electron microscope in accordance with the invention.

A scanning electron microscope as shown in FIG. 1 comprises an electron source 1 with an emission element 2 and an anode 3, a beam alignment system 4, a condenser lens 5, a beam scanning system 6, an exit lens 7 with pole shoes 8, and a specimen table 9 with an adjusting mechanism 10. All these components are accommodated in a housing 12 which comprises a housing wall 13. The housing also includes a specimen chamber 14. The specimen chamber 14 can be closed off partly by means of a hingeable wall section 15 which comprises passages 16 for manipulation of the adjusting mechanism for the specimen table and which, when the hinged joints 17 are opened, takes along the specimen table which is supported by a holder 18. The specimen chamber is further closed off by means of a cover plate 19 which comprises passages for evacuation and the like (not shown).

In a scanning electron microscope a specimen is scanned by means of an electron beam with, for example, a current intensity of $10^{-9}$ A and an energy corresponding to 30 kV. Using the lens system, the electron beam is focussed on the specimen to form a smaller target spot, for example, 50–$10^{10}$ m. Scanning is customarily according to a television line pattern. Radiation generated by interaction of the electron beam and the specimen is detected and the detection signal is preferably applied to a television monitor which operates in synchronism with the specimen scan. Thus, a point-to-point relationship is obtained between the specimen and the image. The enlargement is given by the ratio of the monitor image and the scanned specimen surface and can be varied, for example, between 10 and 200,000. The signal to be used for imaging can be obtained by detection of, for example, reflected electrons, secondary emission electrons, transmitted electrons and absorbed electrons, but also from X-rays or cathode luminescent radiation generated in the specimen. For several of these types of radiation, the angle at which the radiation emerges from the specimen is also important and so is the measured wavelength of the generated electromagnetic radiation.

Figure 2:
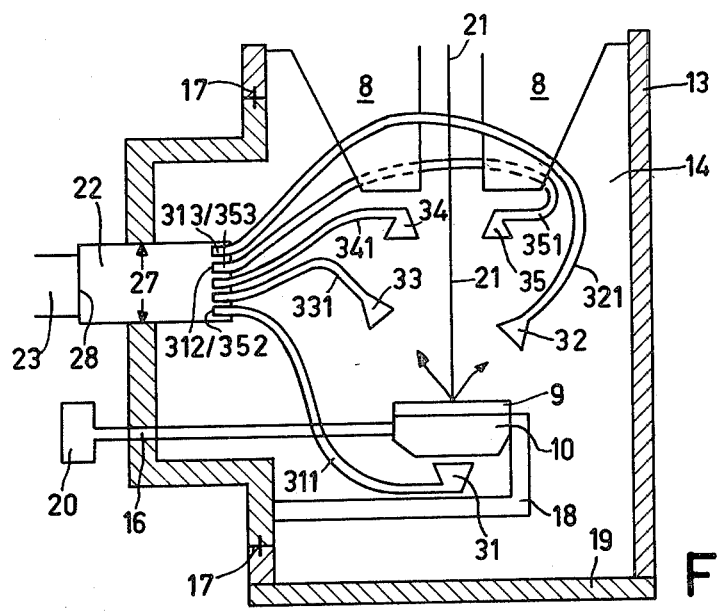
FIG. 2 shows a detection system for such a microscope.

For the positioning of the specimen, the adjusting mechanism 10 of the specimen table is connected to an externally operable knob 20. In practice, several knobs with couplings may be present for this purpose. The adjusting mechanism imparts an x, y and z displacement to the specimen table, a rotation around an optical axis of the system, that is to say an axis which coincides with the non-deflected electron beam 21, and also a tilting movement with respect to this axis. The optical conductors, to be described in detail with reference to FIG. 2, are connected to a passage block 22 which also serves as vacuum seal and whereto a light detector 23 can be connected. A signal thus obtained is applied, by a conductor 24, to a monitor 25.

For a detector system in accordance with the invention, FIG. 2 shows a detector element 31 with a fiber bundle 311 for measuring radiation penetrating the specimen, a detector element 32 with a fiber bundle 321 for measuring secondary electrons, a detector element 33 with a fiber bundle 331 for measuring X-rays and cathode luminescent radiation, and two detectors 34 and 35 with fiber bundles 341 and 351 for measuring reflected electrons. The fiber bundles are sufficiently flexible to ensure conduction of light to the passage block 22 without impeding the free passage of radiation in the specimen chamber. Using this construction, optimum positioning can be simply realized for each of the detector elements. The block 22 is transparent to the luminescent light of the detector elements and on a side which faces inwards it comprises recesses 312 to 352 for the corresponding fiber bundles 311 to 351. The connection of the fiber bundles to the block 22 is very simple and is realized, for example, by a suitable fit in recesses for the fiber bundle ends. Bottom portions 313 to 353 of the recesses as well as the end faces of the fiber bundles are suitably ground to be optically flat. The block 22 consists of, for example, a suitably transparent synthetic material, glass, or quartz and has a comparatively high refractive index in order to increase the internal total reflection. The surface 27 of the block 22 which is, for example, cylindrical, may also be provided with a suitably reflective layer. The entire block, with the exception of the bottoms of the recesses and at least a part of the outer surface 28, is covered with a light-absorbing layer in order to provide shielding against external light. Light is understood to mean herein all radiation causing reaction of a photometer, such as a photomultiplier tube 23, to be connected to the outer surface 28. When use is made of a diaphragm system for channel selection, to be connected to the passage block, the block may be constructed so that each channel, i.e. each light conductor, is separately passed through to the outer surface of the block. Alternatively, the distance between the bottoms of the recesses and the exit face is chosen to be comparatively small. The diaphragm system may in both cases consist of one or more diaphragm plates with one or more apertures which select channels by rotation. One of these diaphragm plates may be mounted directly on a photomultiplier window for the detection. For wavelength-selective measurement, a wavelength-sensitive filter can be arranged either between the luminescent material and the light detector or directly on the entrance face of the detection element which does not contain luminescent material for light measurements.

Figure 3:
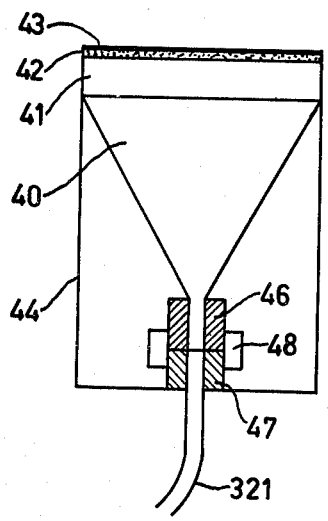
FIGS. 3b and 3c show some embodiments of detection elements for a detection system in accordance with the invention.
Figure 3:
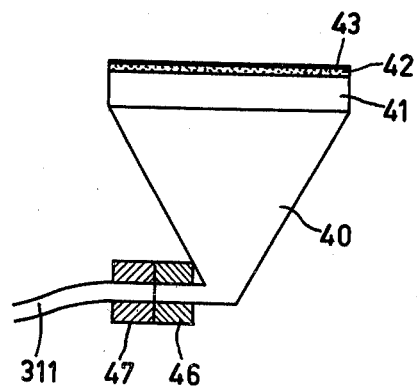
Figure 3:
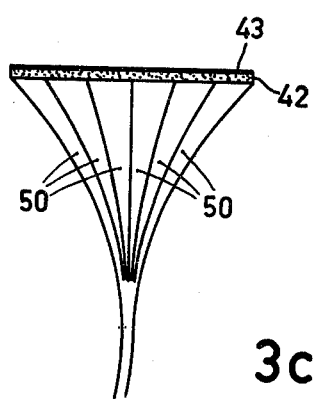

FIG. 3 shows some embodiments of detection elements for a detection system in accordance with the invention. FIG. 3a shows an embodiment comprising a light funnel 40 on which a glass plate 41 is mounted, the plate being provided with a layer 42 of a luminescent material, preferably yttrium silicate. On the layer of luminescent material there is provided an aluminum layer 43 which acts as a reflector for the light generated in the luminescent material. The light funnel, acting as a prism, is made of, for example, a clear synthetic material, such as glass or quartz. The supporting plate 41 is clamped on the funnel, without addition of an emergent, by means of a clamping sleeve 44. The sleeve 44 also serves as a support for the connection 45 for the coupling between the fiber bundle 321 and the light funnel 40. For this purpose, both ends to be coupled are provided with sleeves 46 and 47 which are ground to be flat together with the light conductive material and which are clamped one against the other by means of a holder 48. It may be advantageous to grind the combined end faces so that in practice the optical end faces are slightly withdrawn with respect to the metal end faces. This can be realized, for example, by grinding at different temperatures, thus preventing damaging of the optical end faces when the detector elements are exchanged. FIG. 3b shows a preferred embodiment which is particularly suitable for use in positions where little space is available for the detector element. The light emerging from the luminescent layer 42 is transferred by the light funnel 40, and the support 41, at least substantially to the optical conductor 311. In the embodiment shown in FIG. 1, this detector can be advantageously used, for example, for measuring transmitted electrons and for measuring reflected electrons where normally use is made of two detectors which are symmetrically arranged with respect to the optical axis and directly underneath the pole shoes of the exit lens.

FIG. 3c shows a preferred embodiment of a detector element where the light funnel is formed by glass fibers 50 which widen towards the end and on which the luminescent material 42 is directly deposited. This detector element may be integral with the flexible optical conductor bundle, i.e. it can change over into this bundle without optical interruption. Instead of a vapour-deposited or otherwise deposited layer of luminescent material, use can also be made of a monocrystal thereof on a suspension of luminescent material in a transparent carrier. Either the supporting plate, the light funnel or the core parts of the glass fiber ends may consist of the latter material.

The small dimensions of the detection elements and their easy positioning enable their entrance face to be situated near the specimen. For example, during measurement of secondary electrons, the adverse influencing of the measuring signal by reflected electrons which are also detected can be substantially reduced. The small distance between the specimen and the detector significantly increases the selectivity of a shielding against reflected electrons which is arranged therebetween. The small dimension and easy positioning of the detection element also enables measurement according to the "low-loss imaging" method with a high resolution.

The detector 31 which is arranged directly underneath the specimen in FIG. 2 for the measurement of transmitted electrons, obviously, may also be arranged further away in a transmission electron microscope, for example, behind a speed selection element or an other electron-optical element.

The detection system in accordance with the invention can also be advantageously used in an automatic beam alignment system for an electron microscope in which, for example, four detection elements are symmetrically arranged around the electron beam path and their difference signals control a beam alignment element.

What is claimed is:
1. An electron microscope comprising:
first means for generating an electron beam, second means for providing a specimen in alignment with said electron beam, and detection means for detect- ing radiation occurring from interaction between said specimen and said electron beam, said detection means comprising:

a plurality of separated detector elements for detecting different types of radiation placed in surrounding location about said specimen, each of said detector elements including at least one flexible optical conductor having a light funnel with a first larger end facing said specimen and said light funnel being integral with said optical conductor, and an entrance screen sensitive to radiation to be detected and positioned at said first larger end, said entrance screen including a luminescent layer facing said specimen and a reflector layer overlying said luminescent layer, said luminescent layer and said reflector layer being deposited on an entrance side of said light funnel facing said specimen, a radiation passage structure serving as a wall seal optically coupled at ends remote from said specimen to all of said optical conductors for each of said detector elements, said radiation passage structure being an optically transmissive material of high refractive index, and means responsive to at least one of said detector elements for enabling display of information from said specimen, including an adjustable diaphragm means which is separately connected to said radiation passage structure for detecting at least one radiation conductive signal from the plurality of detector elements.

2. An electron microscope according to claim 1, wherein said light funnel is formed as a prism having an extension.

3. An electron microscope according to claim 1, wherein said light funnel is formed by a plurality of optical fibers widening toward said specimen.

4. An electron microscope according to claim 1, wherein each of said detector elements is separately read by said diaphram means.

5. An electron microscope according to claim 1, wherein a wavelength-sensitive filter is inserted in a radiation path of at least one detector element for detecting radiation generated in said specimen.

6. An electron microscope according to claim 1, wherein a beam scanning means is provided for scanning said specimen with said electron beam.

7. An electron microscope according to claim 1, wherein electron-optical means are arranged between said specimen and at least one detector element for measuring transmitted electrons.

8. An electron microscope according to claim 1, wherein said plurality of detector elements are symmetrically arranged around said electron beam path for supplying signals to an automatic beam alignment system.

9. An electron microscope according to claim 1, wherein said plurality of detector elements include a detector element for measuring radiation penetrating said specimen, a detector element for measuring secondary electrons, a detector element for measuring X-rays and cathode luminescent radiation, and two detector elements for measuring reflected electrons.

10. An electron microscope according to claim 9, wherein said plurality of detector elements are optimally positioned about said specimen.

11. An electron microscope according to claim 1, wherein each of said plurality of detector elements is separately read.

* * * * *